United States Patent [19]

Smith et al.

[11] 4,347,656

[45] Sep. 7, 1982

[54] METHOD OF FABRICATING POLYSILICON ELECTRODES

[75] Inventors: George E. Smith, Murray Hill; Robert J. Strain, Plainfield, both of N.J.

[73] Assignee: Bell Telephone Laboratories, Incorporated, Murray Hill, N.J.

[21] Appl. No.: 218,952

[22] Filed: Dec. 22, 1980

Related U.S. Application Data

[63] Continuation of Ser. No. 10,731, Feb. 9, 1979, abandoned, which is a continuation of Ser. No. 885,385, Mar. 10, 1978, abandoned, which is a continuation of Ser. No. 592,368, Jul. 2, 1975, abandoned, which is a continuation of Ser. No. 458,507, Apr. 8, 1974, Pat. No. 3,921,195, which is a continuation of Ser. No. 85,026, Oct. 29, 1970, abandoned.

[51] Int. Cl.³ .................. H01L 21/285; H01L 21/308
[52] U.S. Cl. .................................... 29/591; 29/571; 29/589; 29/590; 156/653; 156/657; 357/24; 357/59; 427/86; 427/89; 427/93
[58] Field of Search ................ 29/571, 589, 590, 591; 427/86, 89, 93; 156/653, 657; 357/24, 59

[56] References Cited

U.S. PATENT DOCUMENTS

| | | | |
|---|---|---|---|
| 3,576,478 | 4/1971 | Watkins et al. | 357/23 |
| 3,633,078 | 1/1972 | Dill et al. | 357/23 |
| 3,646,665 | 3/1972 | Kim | 29/571 |
| 3,651,349 | 3/1972 | Kahng et al. | 357/24 X |
| 3,654,499 | 4/1972 | Smith | 357/24 X |
| 3,700,932 | 10/1972 | Kahng | 357/24 X |
| 3,770,988 | 11/1973 | Engeler et al. | 357/23 X |
| 3,795,847 | 3/1974 | Engeler et al. | 357/24 |
| 3,921,194 | 11/1975 | Engeler et al. | 357/24 |
| 4,032,948 | 6/1977 | Engeler et al. | 357/24 |

OTHER PUBLICATIONS

Faggin et al., "Silicon Gate Technology", Solid-State Electronics, vol. 13, Aug. 1970, pp. 1125–1144.

Primary Examiner—L. Dewayne Rutledge
Assistant Examiner—W. G. Saba
Attorney, Agent, or Firm—Peter V. D. Wilde

[57] ABSTRACT

A Charge Coupled Device (CCD) structure employing two levels of electrode metallization. The field plate electrodes are arranged in pairs with the second one of each pair partially overlapping and insulated from the first one of its pair and the first one of the next pair. The structure can be operated two-phase or four-phase with four electrodes per bit and three-phase with three electrodes per bit by providing suitable amounts of electrode overlap and suitable drive circuitry. A particularly advantageous mode of two-phase operation with four electrodes per bit is enabled by providing asymmetrical overlapping of electrodes, the second electrode of each pair overlapping the first electrode of its pair more than the first electrode of the next pair.

1 Claim, 7 Drawing Figures

METHOD OF FABRICATING POLYSILICON ELECTRODES

This application is a continuation of application Ser. No. 10,731, filed Feb. 9, 1979 (abandoned) which in turn is a continuation of application Ser. No. 885,385, filed Mar. 10, 1978 (abandoned) which in turn is a continuation of application Ser. No. 592,368, filed July 2, 1975 (abandoned) which in turn is a continuation of application Ser. No. 458,507, filed Apr. 8, 1974 (now U.S. Pat. No. 3,921,195 patented Nov. 18, 1975) which in turn is a continuation of application Ser. No. 85,026, filed Oct. 29, 1970 (now abandoned).

BACKGROUND OF THE INVENTION

This invention relates to information storage devices; and, more particularly, to the class of such devices, known as "charge coupled devices" (CCD's), in which mobile electric charge representing information is coupled to artificially induced potential wells in suitable storage media and is stored and translated therein by application of electric fields.

Previously disclosed forms of such apparatus, e.g., the three-phase embodiments disclosed in U.S. patent application Ser. No. 11,541, filed Feb. 16, 1970, on behalf of W. S. Boyle and G. E. Smith now abandoned and the two-phase embodiments disclosed in U.S. patent application Ser. No. 11,448, filed Feb. 16, 1970, on behalf of D. Kahng and E. H. Nicollian, now U.S. Pat. No. 3,651,349, issued Mar. 21, 1972, are operable but suffer certain disadvantageous characteristics which it is an object of this invention to alleviate.

For example, the three-phase embodiments disclosed in the aforementioned application are not amenable to serpentine data patterns without an unduly complicated interconnection pattern. Fabricating the interconnections is not an appreciable problem per se, but they do require space; and the result is an often unacceptably large area per bit of information.

The two-phase embodiments disclosed in the other application referenced above are readily amenable to serpentine data patterns but are difficult to fabricate in the form disclosed therein. Also, the built-in asymmetry in those devices forecloses the possibility of electronically reversing the direction of data transfer.

SUMMARY OF THE INVENTION

It is an object of our invention to obviate these and other disadvantageous characteristics of prior charge coupled devices, and, more generally, to provide more flexible and more easily fabricated CCD's.

To these and other ends, a CCD structure in accordance with our invention employs two levels of electrode metallization with the electrodes disposed in pairs successively laterally over and defining a path above the surface of a first insulating coating which, in turn, overlies a suitable storage medium. The first electrode of each pair is disposed over and contiguous with the first insulating coating and is completely covered by a second insulating coating which may, but need not, extend over the spaces between the first electrodes of the pairs. The second electrode of each pair is disposed primarily between but also partially overlying the first electrode of its pair and the first electrode of the next pair.

Inasmuch as the thickness of the second insulating coating determines the width of the space between adjacent electrodes, fabrication of very closely spaced electrodes thereby is facilitated. This is an especially advantageous aspect of our invention because very closely spaced electrodes, e.g., about 1000 Å separation, are important if optimum performance is to be obtained in a charge coupled device.

This overlapping of electrodes is an important feature of our invention because the result is a CCD structure in which all portions of the information channel are covered by one or more of the electrodes. In this manner the channel effectively is sealed from contamination which otherwise could penetrate the insulating coating(s) and deleteriously affect device.

The above-described structure in accordance with our invention can be operated in a four-phase mode using four electrodes (two pairs) per bit by applying sinusoidal or other periodic voltages differing by one-fourth cycle, e.g., by 90 degrees, simultaneously to the electrodes in such manner that the same phase is applied to every fourth electrode. This mode yields greatest operational flexibility and highest speed operation because greatest advantage can be taken of field-enhanced charge transfer.

Because of the repetitive symmetries involved, the four-phase clock voltages advantageously are applied to the electrodes through two pairs of conduction paths disposed one pair on either side of the CCD information channel. Each pair of conduction paths includes a first conductor at the same level of metallization as the first electrode of each pair of electrodes and a second conductor overlying the first conductor and physically and electrically separated therefrom by portions of the second insulating coating. In each bit, i.e., each four electrode group, the first electrodes of the two pairs of electrodes are connected to different ones of the first conductors of the pairs of conduction paths; and the second electrodes of the two pairs of electrodes are connected to different ones of the second conductors of the pair of conduction paths. In this manner, every fourth electrode is connected to a common conduction path; and each electrode within each group of four electrodes is connected to a different one of the four conduction paths.

The aforementioned structure, connected as described, also can be operated with a two-phase clock simply by providing a DC offset voltage to the conduction paths so as to create a corresponding DC offset voltage between the first and second electrodes of each pair. The magnitude of this offset voltage is adjusted to provide the requisite asymmetry to the potential wells to ensure unidirectionality of charge transfer. The clock voltages, phase 1 and phase 2, alternately are applied to the conduction paths so that each pair of electrodes is driven by the same phase at the same time, e.g., within each group of four electrodes phase 1 is applied to both electrodes of one pair and phase 2 is applied to both electrodes of the other pair at the same time. In this two-phase mode, the direction of charge transfer can be changed simply by reversing the polarity of the DC offset voltage.

In another embodiment of this invention, the second electrode of each pair overlies the preceding first electrode more than the succeeding first electrode so that the parasitic capacitance between it and the preceding first electrode is greater than that between it and the succeeding first electrode. No direct electrical connections need be made to any of the first electrodes. A pair of conduction paths are disposed one on either side of the CCD channel. Every other one of the second electrodes is connected to a common one of the conduction paths.

In operation, two-phase clock voltages applied to the second electrodes through the conduction paths also cause voltages of lesser magnitude to be induced on the first electrodes because of the capacitive coupling therebetween. The induced voltage is of lesser magnitude than the driving voltage because of capacitive voltage division between the aforementioned parasitic capacitance and the capacitance of the first electrode with respect to the surface of the storage medium. Because the induced voltage is less than the driving voltage, the requisite asymmetry automatically is caused in the potential wells under each pair of electrodes so as to cause the direction of charge transfer to be from the first electrodes toward the second electrodes.

In an especially advantgageous form of this invention a pair of metallization patterns exhibiting staggered symmetry are disposed over a plurality of parallel CCD channels to provide especially compact apparatus capable of sustaining serpentine data flow.

BRIEF DESCRIPTION OF THE DRAWING

The aforementioned and other objects, characteristics, and advantages, and the invention in general will be better understood from the following more detailed description taken in conjunction with the accompanying drawing in which:

FIG. 2 is a plan view of an advantageous CCD embodiment of which FIG. 1 is substantially a cross-section;

It will be appreciated that for simplicity and clarity of explanation the figures have not necessarily been drawn to scale.

DETAILED DESCRIPTION

Figure 1:
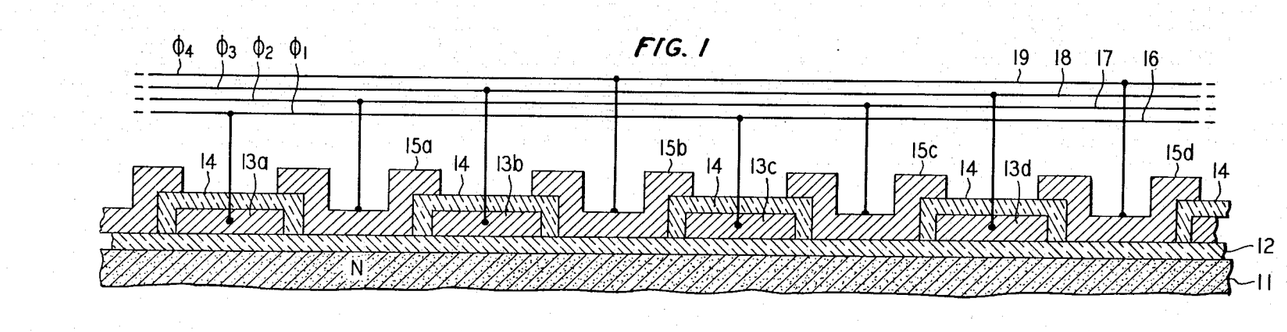
FIG. 1 is a cross-sectional view taken along the channel of a typical charge coupled device structure in accordance with this invention.

With more specific reference now to the drawing, FIG. 1 shows a cross-sectional view taken along the channel of a CCD structure in accordance with a first embodiment of this invention. As shown, the structure includes a bulk portion 11 which is shown, for purposes of illustration only, as N-type semiconductor. In view of the disclosure in U.S. patent application Ser. No. 47,205, filed June 18, 1970 now U.S. Pat. No. 3,700,932, issued Oct. 24, 1972, and assigned to the assignee hereof, it will be appreciated that bulk portion 11 may be selected from among any of a wide variety of suitable storage media, such as, for example, semiconductors such as silicon, semi-insulators, and insulators.

A first insulating layer 12 overlies the storage medium 11. Layer 12 advantageously is a dual-thickness layer which is relatively thin, e.g., 1000 Å, over the CCD channel where the instant cross-section is taken, and is relatively thick outside the channel area so that voltages applied to conduction paths and other overlay contacts outside the channel area do not substantially perturb the surface potential of the storage medium outside the intended channel. Overlying layer 12 are a plurality of spaced electrodes designated with the reference numeral 13, followed by an alphabetic subscript a, b, c, d, etc. Overlying each electrode 13 is a second insulating coating 14 which may be formed in situ by oxidizing electrodes 13 or which may be deposited, as desired.

Disposed primarily between but partially overlapping electrodes 13 are a second plurality of electrodes 15, similarly designated, and which constitute a second level of metallization.

In the following discussion, the electrodes of the above-described structure often will be considered in pairs, each pair including one electrode, e.g., 13a of the first level of metallization, and the next adjacent electrode, e.g., 15a of the second level of metallization. This terminology is convenient because of the symmetries involved.

It will be appreciated that the foregoing structure can be fabricated in a variety of ways. For example, the so-called "silicon gate" technology, such as disclosed in U.S. Pat. No. 3,475,234, issued Oct. 28, 1969, to R. E. Kerwin et al, can be used. In this case, the first level of "metallization" (electrodes 13) is formed by depositing a layer of silicon; defining the silicon into electrode geometries by a photolithographic process; oxidizing the remaining silicon electrodes; depositing a layer of a suitable metal such as platinum, palladium, gold, or aluminum, and photolithographically defining this second layer of metallization into the geometric patterns desired for electrodes 15.

Alternatively, a so-called "film-forming" metal, such as the oxidizable metals tungsten, zirconium, aluminum, hafnium, molybdenum, or nickel, may be substituted for silicon for the first layer of metallization. Still another alternative which may be employed is to use any suitably conductive material instead of silicon for the first level of metallization and then to deposit, as by sputtering, an insulating coating thereover rather than to form the insulating coating by chemical conversion.

It will be appreciated that the overlapping of electrodes illustrated in FIG. 1 is an important feature of our invention because the result is a CCD structure in which all portions of the information channel are covered by one or more of the electrodes. In this manner the channel effectively is sealed from contamination which otherwise could penetrate the insulating coatings and deleteriously affect the device.

The above-described structure can be operated in a four-phase mode using four electrodes (two pairs) per bit by applying sinusoidal or periodic voltages differing by one-fourth cycle successively to every fourth electrode. This is depicted schematically in FIG. 1 where every fourth electrode is shown connected to a common one of four conduction paths 16–19. Application of four-phase clock voltages $\Phi_1$–$10_{14}$ to these conduction paths in a similar manner as taught in the aforementioned Boyl-Smith application for three-phase applications results in a traveling potential minimum within the storage medium 11 to which mobile charges can be coupled for storing and transferring information. Clearly the four-phase mode yields great operational flexibility and high speed operation because the direction of charge transfer can be reversed merely by changing the applied clock potentials and because greatest advantage can be taken of field-enhanced charge transfer.

Because of the repetitive symmetries involved, the four-phase clock voltages advantageously are applied through two pairs of conduction paths disposed one pair on either side of the CCD channel. This is illustrated by the plan view shown in FIG. 2. The cross-sectional view shown in FIG. 1 is substantially that which would be seen in a cross-section taken on line 1′—1′ in FIG. 2.

Figure 2:
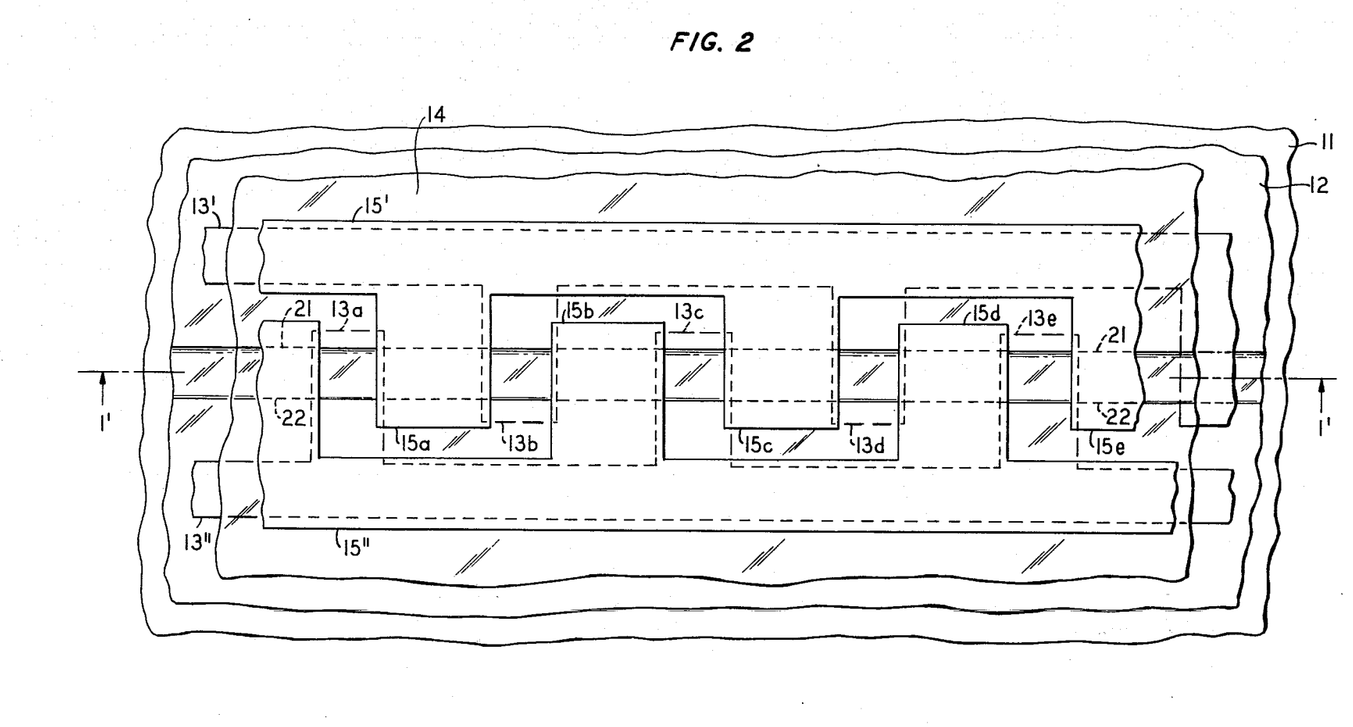

In FIG. 2, the information channel is between parallel broken lines 21 and 21 where a relatively thin insulating layer, e.g., 1000 Å of silicon oxide, overlies and is contiguous with the surface of a storage medium 11. Outside the channel, a thicker insulating layer 12, e.g., 10,000 Å of silicon oxide or silicon nitride, overlies and is contiguous with the rest of the surface of the storage medium, these outlying portions being thicker to prevent voltages applied to the conduction paths from substantially perturbing the surface potential of the storage medium outside the channel.

Over this dual-thickness insulating coating, two conduction paths 13′ and 13″, constituting a first level of metallization, are disposed one on either side of the channel. Conduction paths 13′ and 13″ include interdigitated rectangular portions 13a, 13b, 13c, 13d, and 13e which extend over the channel and serve as field plate electrodes. Electrodes 13a, 13c, and 13e are a part of conduction path 13″; and electrodes 13b and 13d are a part of conduction path 13′.

A second insulating coating is disposed over at least the electrodes of the first level of metallization; and two other conduction paths 15′ and 15″, constituting a second level of metallization, are disposed one on either side of the channel over conduction paths 13′ and 13″, respectively. Conduction paths 15′ and 15″ also include interdigitated rectangular portions, 15a–15c, which extend over the channel and serve as field plate electrodes. Electrodes 15a, 15c, and 15e are a part of conduction path 15′; and electrodes 15b and 15d are a part of conduction path 15″.

In four-phase operation, phase one ($\Phi_1$) is applied to conduction path 13″; phase two ($\Phi_2$) is applied to conduction path 15′; phase three ($\Phi_3$) is applied to conduction path 13′; and phase four ($\Phi_4$) is applied to conduction path 15″.

An important feature of the conduction path arrangement shown in FIG. 2 is that the conduction path (15″) for phase four overlies the conduction path (13″) for phase one; and the conduction path (15′) for phase two overlies the conduction path (13′) for phase three. Whether conduction path 15″ overlies 13″ or vice versa is not important. What is important is the parasitic capacitive coupling resulting from the illustrated juxtaposition. In structures where silicon or any other material exhibiting substantial resistance is used for the first level of metallization, e.g., conduction paths 13′ and 13″, the series resistance may be 100 $\omega/\square$ or higher. Because of this resistance and the distributed capacitive coupling to the storage medium, such conduction paths act as transmission lines and thus can substantially retard the phase of signals thereon. However, because $\Phi_4$ is 90 degrees ahead of $\Phi_1$ and because $\Phi_2$ is 90 degrees ahead of $\Phi_3$, $\Phi_4$ will tend to advance the phase of $\Phi_1$ if their conduction paths are capacitively coupled; and $\Phi_2$ will tend to advance the phase of $\Phi_3$ if their conduction paths are capacitively coupled. This phase-advancing effect can be used to compensate for the phase-retarding effect of resistive conduction paths. This is done in the apparatus of FIG. 2.

To avoid the complications inherent in generating, synchronizing, and transmitting four-phase clock pulses, the aforementioned structures depicted in FIGS. 1 and 2 also can be operated with a two-phase clock simply by providing, in addition to the two-phase clock signals, a DC offset voltage to the conduction paths so as to create a corresponding DC offset voltage between the first and second electrodes of each pair. In this case, the clock voltages, phase one and phase two, alternately are applied to pairs of the four conduction paths so that each of said pairs of electrodes is driven by the same clock phase at the same time. The function of the DC offset voltage is to provide the requisite asymmetry to the potential wells to ensure unidirectionality of charge transfer.

More specifically, now, with reference to FIG. 1, for two-phase operation, a DC voltage could be applied between conduction paths 16 and 17 and between conduction paths 18 and 19 so as to make electrodes 15 all positive (or all negative) with respect to electrodes 13. Clock phase one then would be applied to conduction paths 16 and 17 simultaneously; and clock phase two would be applied to conduction paths 18 and 19 simultaneously. At the next clock cycle, phase one would be applied to conduction paths 18 and 19 simultaneously; and phase two would be applied to 16 and 17 simultaneously. And so on, with information advancing two electrodes to the left (or right, depending on the polarity of the DC offset voltage) at each reversal of the clock.

Inasmuch as the direction of charge transfer is dependent on the polarity of the DC offset voltage, the direction can be reversed electronically simply by reversing the polarity of that voltage. And, of course, it will be appreciated that the DC offset voltage need not be applied between lines 16 and 17 and between lines 18 and 19, but may as well be applied between lines 17 and 18 and between 16 and 19, in which case the clock phases would be applied simultaneously to the newly-paired lines, i.e., to 17 and 18 and to 16 and 19.

In the above-described embodiments, four conduction paths per channel are used. If either this plurality of conduction paths, or the four-phase clock or the two-phase clock plus DC offset are considered a problem in any particular application, similar operating results can be obtained in accordance with this invention with a two-phase clock and two conduction paths per channel merely by providing capacitive and resistive coupling between the first and second electrodes of each pair.

Figure 3:
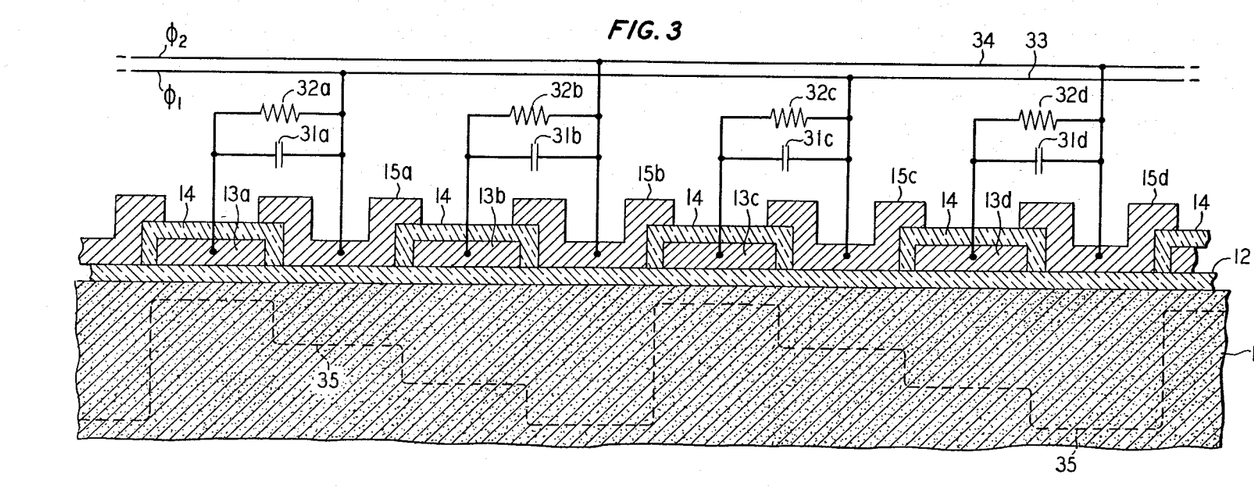
FIG. 3 is a cross-sectional view similar to FIG. 1 but additionally showing capacitive and resistive coupling between each pair of electrodes.

This is illustrated schematically in FIG. 3 where elements 31a–31d represent capacitors, and elements 32a–32d represent resistors in parallel pairs with the capacitors coupling electrodes 13 to 15. Every other one of electrodes 15 is shown coupled to a common one of a pair of conduction paths 33 and 34 to which two-phase clock pulses $\Phi_1$ and $\Phi_2$ are applied.

In operation, two-phase clock voltages applied to electrodes 15 cause voltages of lesser magnitude to be induced on electrodes 13 because of the capacitive coupling. This induced voltage is of lesser magnitude than the clock voltages because of capacitive voltage division between the capacitors 21 and the capacitance of electrodes 13 with respect to the surface of storage medium 11. Because the voltage induced on electrodes 13 is of lesser magnitude than the voltages applied to electrodes 15, the surface potential under electrodes 13 is less negative than the surface potential induced under electrodes 15 for any given negative clock voltage.

Resistors 32 are included not for coupling voltage pulses from electrodes 15 to electrodes 13 but rather for "bleeding" charge from electrodes 13 to prevent charge from accumulating thereon. Consequently the resistance of resistors 32 should be much greater than the impedance of capacitors 31 and much less than the resistance of the insulator between electrodes 13 and the surface of storage medium 11 to prevent spurious discharge. For resistors 32, resistances between $10^5$ and $10^{11}$ ohms, typically about $10^6$–$10^8$ ohms, normally are appropriate. It will be appreciated, however, that although the exact resistance value is not critical the function which these resistors serve is important to prevent undue charge accumulation on electrodes 13.

Of course, it will be appreciated that these bleeder resistors need not be used in situations where spurious discharge and other effects of charge accumulation are not a problem. It will also be appreciated that one need not use a separate bleeder resistor between each pair of electrodes. Rather a plurality of electrodes 13 may be connected to a common conduction path and a single bleeder resistor can be connected between that conduction path and the conduction path to which a corresponding plurality of electrodes 15 are connected. More specifically, with reference to FIG. 3, since electrodes 15a and 15c are connected to a common conduction path 33, electrodes 13a and 13c can be connected to another conduction path (not shown) and then a bleeder resistor can be connected between conduction path 33 and the path to which electrodes 13a and 13c are connected.

In FIG. 3, broken line 35 represents schematically the surface potential (depth of the potential wells) adjacent the surface of storage medium 11. Where, as here, the operating medium is semiconductive, broken line 35 also may be considered as representing schematically the boundaries of depletion regions corresponding to the surface potential. It should be observed that because of the capacitive coupling between electrodes each of the combined potential wells under each pair of electrodes is asymmetrical in such a manner as to cause the preferred direction of positive charge transfer to be from the first electrode, e.g., 13a, of each pair toward the second electrode, 15a, of that pair.

Figure 4:
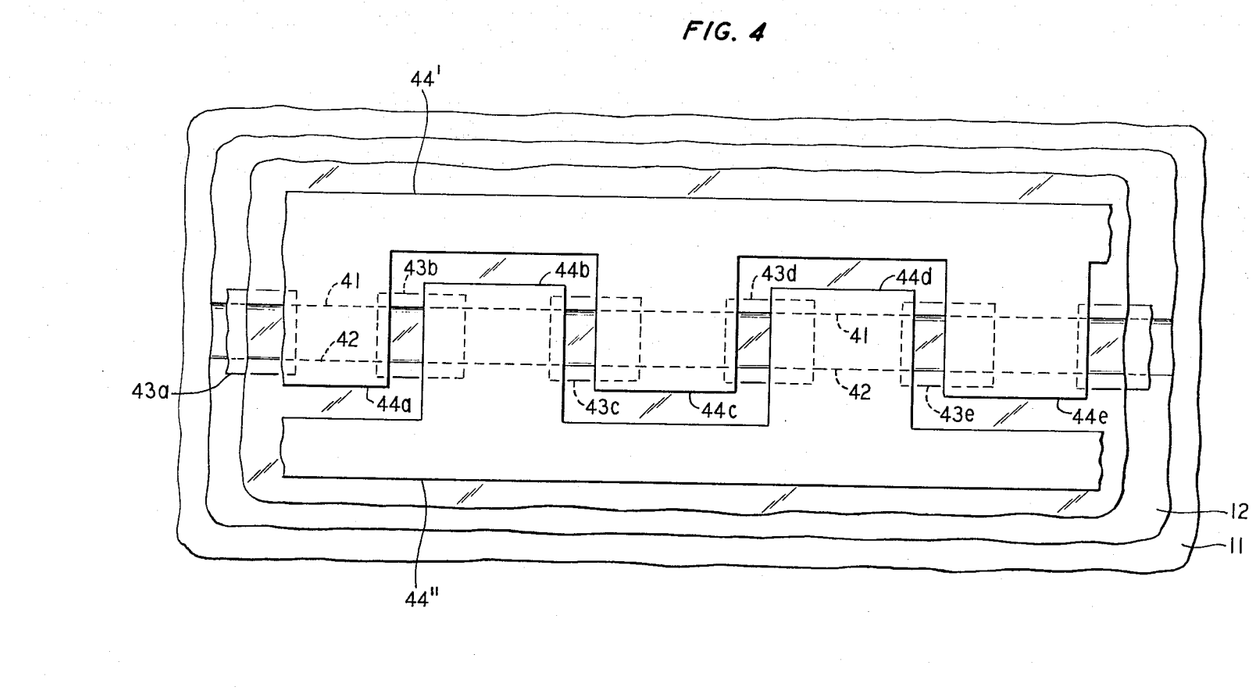
FIG. 4 is a plan view of another CCD embodiment in accordance with this invention adapted to operate as shown in FIG. 3.

With reference now to FIG. 4 there is shown a plan view of a portion of apparatus adapted to operate in the manner described with reference to FIG. 3. In FIG. 4, the information channel is between broken lines 41 and 42 where, as in FIG. 2, an insulating layer is disposed over the channel and is thinner than is the rest of the insulating layer theresurrounding.

Over this dual-thickness insulating coating are disposed a plurality of localized electrodes 43a–43f (indicated by broken line rectangles correspondingly labeled), these electrodes constituting a first level of metallization.

A second insulating coating is disposed over at least the electrodes of the first level of metallization; and a pair of conduction paths, 44' and 44" are disposed one on either side of the channel. Conduction paths 44' and 44" include interdigitated rectangular portions 44a–44e which extend over the channel and serve as field plate electrodes. As can be seen, electrodes 44a, 44c, and 44e are a part of conduction path 44', while electrodes 44b and 44d are a part of conduction path 44".

In operation two-phase clock voltages alternately are applied (with respect to the storage medium) to conduction paths 44' and 44". One of electrodes 43 (of the first level of metallization) serves as the first electrode of each pair of electrodes; and one of electrodes 44 serves as the second electrode of each pair of electrodes.

To provide the capacitive coupling between the electrodes of each pair, each electrode 44 overlies the preceding electrode 43 more than it overlies the succeeding electrode 43. More specifically, electrode 44b overlies 43b more than it (electrode 44b) overlies 43c; electrode 44c overlies 43c more than 43d; etc. It will be appreciated that the amount of capacitor coupling between any given electrode 44 and any given electrode 43 is proportional to the area by which the one overlies the other.

In more detail now, consider electrodes 43a, 44a, 44b, and 43c. It is advantageous that electrode 44a overlaps 43a more than 43b, i.e., greater capacitive coupling to 43a than to 43b, so that a voltage of greater magnitude is induced on 43a than is induced on 43b. This tends to enhance the asymmetry in the potential wells so that unidirectionality of charge transfer also is enhanced. This asymmetry in the potential wells also is enhanced by the fact that the two electrodes 44 overlying any given electrode 43 are connected to opposite clock phases. That is, electrodes 44a and 44b both overlie electrode 43b; electrode 44a is part of conduction path 44' which is driven by one phase; and electrode 44b is part of conduction path 44" which is driven by the opposite phase. Because of this fact, the "net overlap", i.e., the amount by which the area of 44b's overlap exceeds the area of 44a's overlap, is important. The general rule of thumb is that as net overlap increases the difference between the surface potential under electrodes 43b and 44b decreases. By way of example, a net overlap area equal to about 20% of the total area of electrode 43 will be suitable in structures where the insulating layer between electrodes 43 and 44 is about 1000 Å of silicon oxide and where the two-phase clock voltages are pulses of $-6$ volts and $-30$ volts, respectively.

At least about 4 kT, i.e., about 0.1 volt, difference in surface potential, i.e., potential well asymmetry, between adjacent potential wells is required to provide desired directionality of charge transfer. In practice, however, we have found that for optimum operation this asymmetry advantageously is made about equal to one-half the difference between the peak-to-peak variations in surface potential between adjacent electrodes or electrode pairs. Thus, where applied clock voltages are $-6$ volts and $-16$ volts, a potential well asymmetry of about 5 volts (one-half the difference) is effective.

Figure 5:
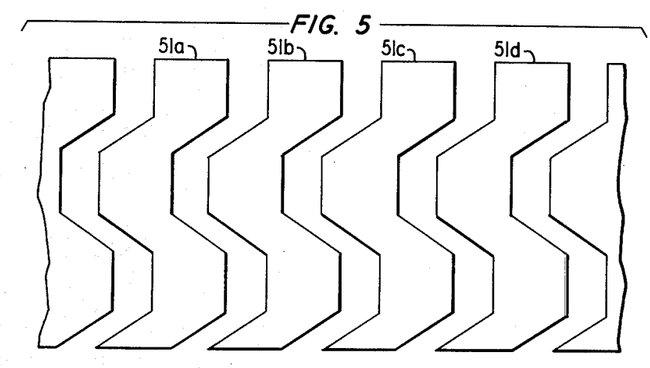
FIGS. 5 and 6 depict first and second level metallization patterns which are, in turn, shown superposed in FIG. 7 to provide an advantageous serpentine data pattern in accordance with this invention.
Figure 6:
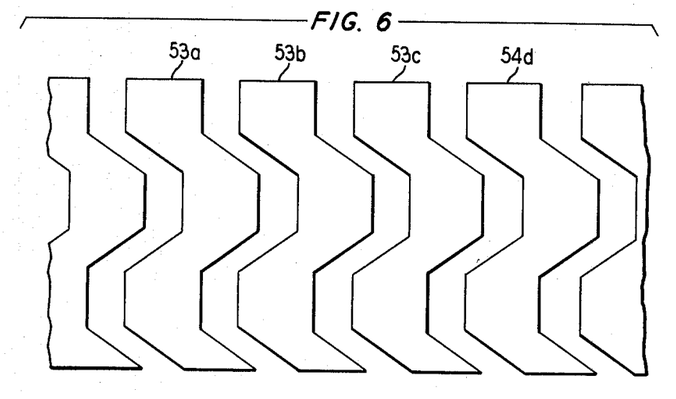
Figure 7:
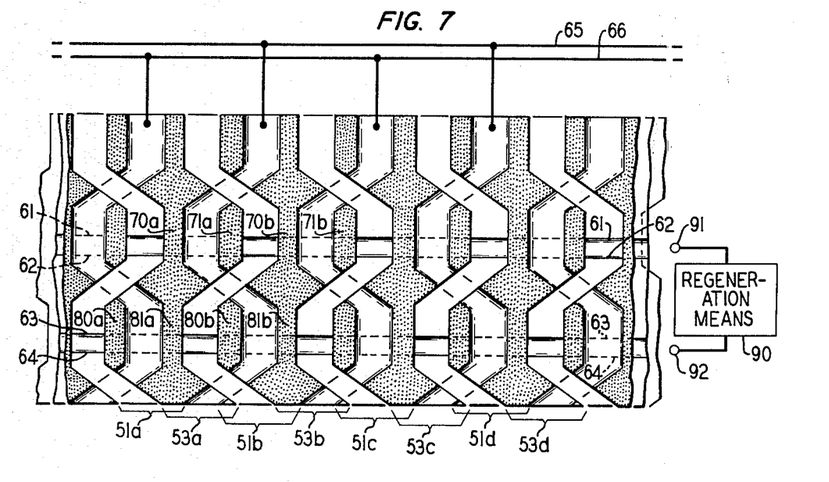

If serpentine data patterns are desired, the apparatus of FIG. 4 advantageously is modified in accordance with this invention to that shown in FIGS. 5–7.

FIGS. 5 and 6 depict, respectively, first level and second level metallization patterns which are combined with an insulating coating therebetween, as in the foregoing embodiments, and disposed over a dual-thickness insulating coating on a storage medium to achieve the apparatus depicted in FIG. 7. More specifically, geometric patterns 51a–51d in FIG. 5 are the electrode configurations used for the first level of metallization in FIG. 7; and geometric patterns 53a–53d are the electrode configurations used for the second level of metallization in FIG. 7. In FIG. 7 the electrode patterns are labeled correspondingly with the patterns of FIGS. 5 and 6.

Two information channels are depicted in FIG. 7, a first one lying between parallel broken lines 61 and 62 and a second one lying between parallel broken lines 63 and 64. It should be noted that in contradistinction to the foregoing embodiments, the electrode and conduction path metallizations, i.e., patterns 51a–51d and 53a–53d, are disposed transverse to the channels in FIG. 7, whereas in FIGS. 2 and 4 the conduction path metallizations are disposed longitudinally with respect to the channels.

In FIG. 7 the stipled portions of the second level of metallization, i.e., of patterns 53a–53d, are those portions of those patterns which overlie some portion of the first level of metallization. It is, of course, these stipled overlap portions which provide the capacitive coupling desired for operation of the type described with reference to FIGS. 3 and 4.

In more detail now, note that with respect to the first channel (between lines 61 and 62), electrode 53a overlaps electrode 51a in stipled dumbbell-shaped portion 70a more than it (53a) overlaps electrode 51b (stipled hexagonal-shaped portion 71a). Similarly, the stipled dumbbell-shaped portion 70b by which electrode 53b overlaps electrode 51b is larger than the stipled hexagonal-shaped portion 71b by which electrode 53b overlaps electrode 51c. And, in all cases, over the first channel (between lines 61 and 62) each electrode of the second level of metallization overlaps to the left more than it overlaps to the right. Accordingly, the net capacitive coupling is to the left; and so, in accordance with the foregoing teachings with respect to FIGS. 3 and 4, the direction of charge transfer is to the right in the first channel in FIG. 7.

But, with respect to the second channel (between lines 63 and 64), the stipled dumbbell-shaped overlap portion 81a by which electrode 53a overlaps electrode 51a is larger than the stipled hexagonal-shaped portion 80a by which electrode 53a overlaps the pervious electrode (not labeled) of the first level of metallization. Similarly, the stipled dumbbell-shaped portion 81b by which electrode 53b overlaps electrode 51b is larger than the stipled hexagonal-shaped portion 80b by which electrode 53b overlaps electrode 51a. And, in all cases, over the second channel (between lines 63 and 64) each electrode of the second level of metallization overlaps to the right more than it overlaps to the left. Accordingly, the net capacitive coupling is to the right; and so the direction of charge transfer is to the left in the second channel.

In light of the foregoing, it will be understood that application of two-phase clock voltages to electrodes 53 through clock lines 65 and 66, shown connected thereto, causes information to advance to the right in the first channel and to the left in the second channel. This is a basic feature required for serpentine data flow.

Of course, the channels must be coupled together at the ends so that information at the end of one channel is coupled into the beginning of the next channel. Means for such coupling are indicated schematically in FIG. 7 by the box 90, labeled "Regeneration Means", with electrodes 91 and 92 extending toward the first and second channels, respectively. Inasmuch as charge coupled apparatus in accordance with this invention, like all CCD apparatus heretofore, is subject to some charge loss upon each charge transfer, regenerating the signal while coupling to the next channel will be advantageous in most digital applications. A variety of suitable regenerators are known, some of which are described in U.S. patent applications, Ser. Nos. 82,959, and 82,993, both filed Oct. 22, 1970, and both now abandoned.

And finally, for completeness, it will be understood that the staggered symmetric metallization patterns of FIGS. 5–7 are not limited to use over two channels but may be extending in the depicted staggered symmetric fashion over a vast plurality of channels in which information can be made to transfer in opposite directions in successive channels. Also, of course, apparatus such as shown in FIG. 4 and in FIG. 7 can be operated in a four-phase mode if desired by applying four-phase voltages to every electrode of both levels of metallization if such operation is deemed advantageous in a particular situation.

Although our invention has been described in part by making detailed reference to certain specific embodiments, such detail is intended to be and will be understood to be instructive rather than restrictive. It will be appreciated by those in the art that many variations may be made in the structure and modes of operation without departing from the spirit and scope of our invention as disclosed in the teachings contained herein.

What is claimed is:

1. A method for making an electrical circuit comprising a silicon semiconductor device having a silicon substrate, an insulating material having a maximum thickness of approximately 1000 Angstroms covering a portion of the substrate, and at least one pair of separate closely spaced electrodes on the insulating material, a first electrode of the pair formed by a first metallization step, and a second electrode of the pair formed by a second metallization step so as to partially overlap the first electrode of the pair, the pair of electrodes defining a channel region in the silicon semiconductor substrate directly underlying said pair of electrodes, the said channel region being of a single conductivity type the method comprising the steps of (a) forming a first insulating layer on a silicon substrate, said layer comprising a thin portion, and a relatively thick portion surrounding the thin portion, the thin portion having a maximum thickness of approximately 1000 Angstroms, (b) depositing a first conductive layer comprising silicon on the first insulating layer, (c) shaping by a lithographic process the silicon layer into a geometry including at least one silicon electrode as the first metallization step to produce the first electrode of the pair of closely spaced electrodes, the electrode being formed on the thin portion of the first insulating layer overlying a first part of said channel region of the silicon substrate, and completely physically spaced from said channel region, (d) forming a second silicon dioxide layer over the exposed surface of the silicon electrode, said layer being formed in situ by oxidizing the silicon electrode to form a silicon dioxide layer by chemical conversion of the silicon electrode, (e) depositing a second conductive layer overlying at least the entire channel region, (f) shaping by a lithographic process the second conductive layer into a geometry including at least one second electrode as the second metallization step to produce the second of the pair of closely spaced electrodes, the second electrode being formed overlying the remaining part of said channel region of the silicon substrate and covering at least part of the second silicon dioxide layer but completely separate from the first electrode and the substrate throughout said channel region, said second electrode thereby being formed overlying at least part of the first electrode so that the first electrode overlying the first part of said channel region and the part of the second electrode overlying the remaining part of said channel region are separated side by side only by the second silicon dioxide layer, and both electrodes are separated from the channel region, and electrically connecting said first and second electrodes of the semiconductor device into an electrical circuit.

* * * * *

Disclaimer 4,347,656.—*George E. Smith*, Murray Hill and *Robert J. Strain*, Plainfield, N.J. METHOD OF FABRICATING POLYSILICON ELECTRODES. Patent dated Sept. 7, 1982. Disclaimer filed Oct. 14, 1982, by the assignee, *Bell Telephone Laboratories, Inc.*

The term of this patent subsequent to Nov. 18, 1992 has been disclaimed.

[*Official Gazette December 28, 1982.*]